(12) United States Patent
Xiong et al.

(10) Patent No.: US 8,067,792 B2
(45) Date of Patent: Nov. 29, 2011

(54) MEMORY DEVICE WITH MEMORY CELL INCLUDING MUGFET AND FIN CAPACITOR

(75) Inventors: Weize Xiong, Austin, TX (US); Andrew Marshall, Dallas, TX (US); Cloves R. Cleavelin, Dallas, TX (US); Howard L. Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 12/554,660

(22) Filed: Sep. 4, 2009

(65) Prior Publication Data

US 2010/0002494 A1 Jan. 7, 2010

Related U.S. Application Data

(62) Division of application No. 11/924,817, filed on Oct. 26, 2007, now Pat. No. 7,683,417.

(51) Int. Cl.
*H01L 27/108* (2006.01)
*G11C 11/00* (2006.01)

(52) U.S. Cl. .............. 257/298; 257/E27.084; 365/148

(58) Field of Classification Search .............. 257/296, 257/E27.084, 298, 306, 315; 365/149, 189.011, 365/63, 104, 148
See application file for complete search history.

(56) References Cited

U.S. PATENT DOCUMENTS

| | | | | |
|---|---|---|---|---|
| 5,025,494 A | * | 6/1991 | Gill et al. | 257/316 |
| 5,107,459 A | * | 4/1992 | Chu et al. | 365/63 |
| 5,471,416 A | * | 11/1995 | Azmanov | 365/104 |
| 5,943,569 A | | 8/1999 | Shih et al. | |
| 6,773,972 B2 | * | 8/2004 | Marshall et al. | 438/176 |
| 2004/0251487 A1 | * | 12/2004 | Wu et al. | 257/315 |
| 2005/0196918 A1 | | 9/2005 | Schwerin | |
| 2007/0052040 A1 | | 3/2007 | Schwerin | |
| 2007/0117311 A1 | | 5/2007 | Zaman | |
| 2007/0262386 A1 | | 11/2007 | Gossner et al. | |
| 2008/0237796 A1 | * | 10/2008 | Doyle et al. | 257/534 |

OTHER PUBLICATIONS

Subramanian et al., "Impact of fin width on digital and analog performance of n-FinFET," 2007, Solid-State Electronics, vol. 51, p. 551-559.
Cho et al., "A novel spacer process for sub-10-nm thick vertical MOS and its integration with planar MOS device," 2006, IEEE Transaction on nanotechnology, vol. 6, No. 5, p. 554-563.
Sze, "Semiconductor Devices, Physics and Tecnology," 2002, p. 44.

* cited by examiner

*Primary Examiner* — Thomas L Dickey
*Assistant Examiner* — Nikolay Yushin
(74) *Attorney, Agent, or Firm* — Rose Alyssa Keagy; Wade J. Brady, III; Frederick J. Telecky, Jr.

(57) ABSTRACT

One embodiment of the present invention relates to a memory cell. The memory cell includes a multi-gate field effect transistor associated with a first region of a semiconductor fin. The memory cell also includes a fin capacitor coupled to a drain of the multi-gate field effect transistor and associated with a second region of the semiconductor fin, where the fin capacitor has an approximately degenerate doping concentration in the second region. Other devices and methods are also disclosed.

14 Claims, 5 Drawing Sheets

MEMORY DEVICE WITH MEMORY CELL INCLUDING MUGFET AND FIN CAPACITOR

CROSS-REFERENCE TO NONPROVISIONAL APPLICATION

This is a division of application Ser. No. 11/924,817, filed Oct. 26, 2007, the entire disclosure of which is hereby incorporated by reference.

FIELD OF INVENTION

The present invention relates generally to semiconductor devices and more particularly to semiconductor memories.

BACKGROUND OF THE INVENTION

Several trends presently exist in the semiconductor and electronics industry. One of these trends is that recent generations of portable electronic devices are using more memory than previous generations. This increase in memory allows these new devices to store more data, such as music or images, and also provides the devices with more computational power and speed.

Dynamic random access memory (DRAM) is one type of random access memory where individual bits of data are stored in separate capacitors. Because the capacitors leak charge, any data stored in a capacitor will fade unless it is refreshed periodically. Because of this characteristic, a DRAM is a dynamic memory, as opposed to SRAM and other types of static memory. When compared to SRAM, one advantage of DRAM is that it can have very high densities because of its simplistic memory cell structure.

In many arenas, DRAM is often a relatively affordable solution when large amounts of data storage are desired. This is because DRAMs is often relatively dense compared to other types of memory, such as static random access memory (SRAM). In other words, the capacitive elements that make up a DRAM array can be packed together tightly, such that many cells can be squeezed into a small area.

While DRAM is relatively dense, it suffers from a drawback in that it may not be compatible with manufacturing flows. For example, one type of DRAM is a trench capacitor DRAM, where trench capacitors that act as memory elements are etched into a silicon substrate. Generally, these trench capacitors would add extra mask steps in a manufacturing flow, and as such, are not typically included in these flows. In addition, if DRAM is to continue to be an attractive technology (i.e., dense), designers will likely want it to remain dense in comparison to other types of memory.

Therefore, a need has arisen to provide systems and methods relating to relatively dense memory devices that can be integrated into manufacturing flows.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a memory cell. The memory cell includes a multi-gate field effect transistor associated with a first region of a semiconductor fin. The memory cell also includes a fin capacitor coupled to a drain of the multi-gate field effect transistor and associated with a second region of the semiconductor fin, where the fin capacitor has an approximately degenerate doping concentration in the second region.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
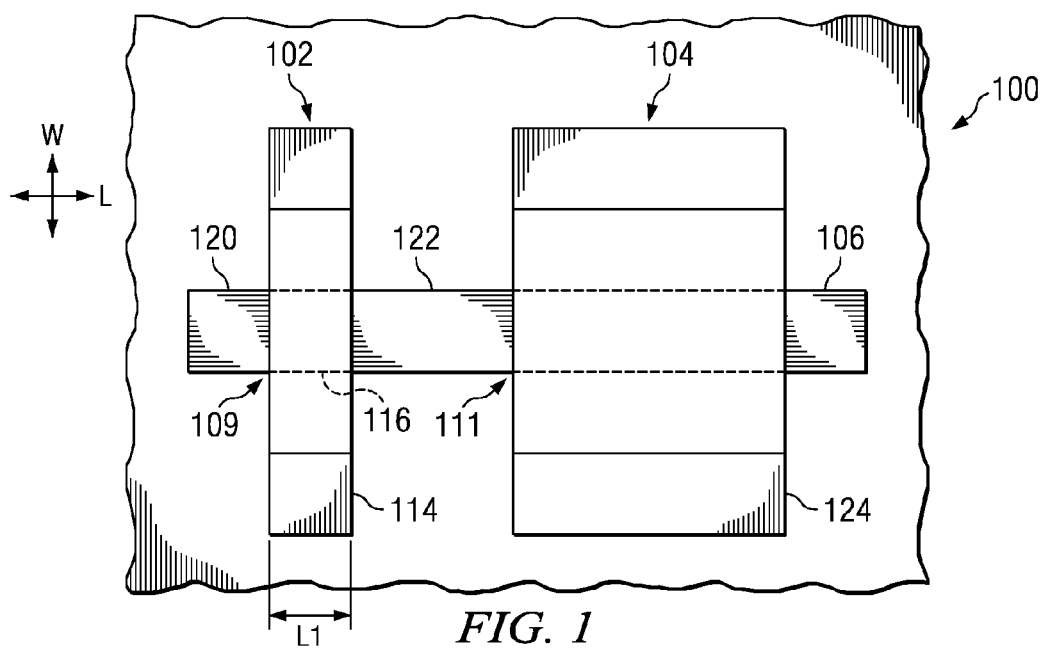
FIG. 1 shows a top-view of a memory cell.

The present invention will now be described with reference to the attached drawing figures, wherein like reference numerals are used to refer to like elements throughout, and wherein the illustrated structures and devices are not necessarily drawn to scale. Further, to the extent that some illustrated embodiments may be described with reference to a multi-gate field effect transistor (MuGFET), it will be appreciated that the term MuGFET includes, but is not limited to: FinFETs, tri-gate transistors, omega transistors, and the like, all of which are contemplated as falling within the scope of the present invention.

Figure 2:
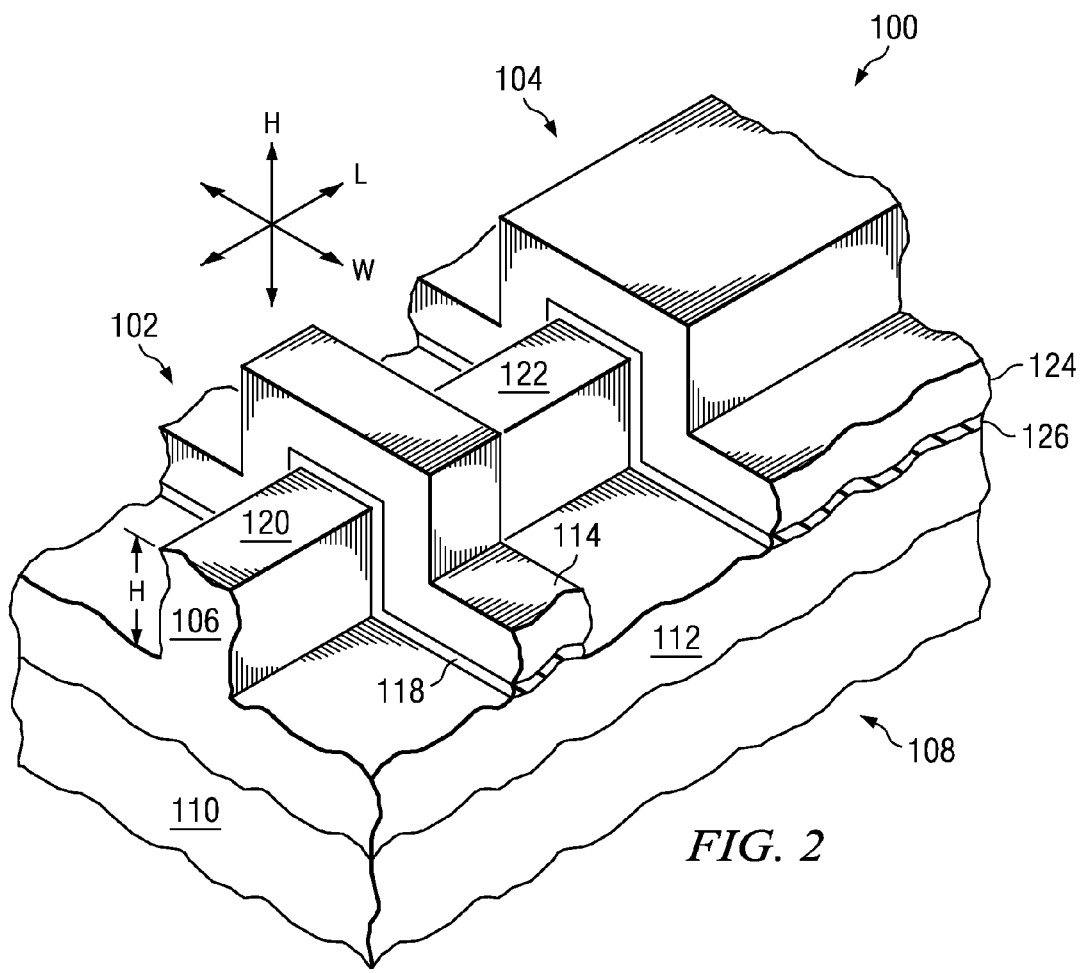
FIG. 2 shows a three-dimensional perspective view of a memory cell.

Referring now to FIGS. 1-2, one can see one example of a memory cell 100 in accordance with aspects of the present invention. The memory cell 100 includes a multi-gate field effect transistor (MuGFET) 102, and a fin capacitor 104 coupled to a drain of the MuGFET. Often, the MuGFET 102 and fin capacitor 104 are both associated with at least one semiconductor fin 106 that vertically extends from a semiconductor body 108, where the MuGFET 102 is associated with a first portion 109 of the semiconductor fin and the fin capacitor 104 is associated with a second portion 111 of the semiconductor fin.

The semiconductor body 108 typically comprises an optional insulator layer 112 and a semiconductor substrate layer 110. For example, the semiconductor body 108 could be bulk silicon, silicon on insulator (SOI), silicon-germanium on insulator, or any other type of semiconductor body.

The MuGFET 102 comprises a gate electrode 114 that straddles the semiconductor fin 106, where a channel region 116 is associated with the fin 106 under the gate electrode 114. A dielectric layer 118 is sandwiched between the semiconductor fin 106 and the gate electrode 114, and electrically separates the fin 106 from the gate electrode 114. A source 120 and drain 122 are formed within the semiconductor fin 106 laterally separated from one another by a gate length $L_1$ as measured across the channel region 116. Often, the source 120 and drain 122 are highly doped and have a first conductivity type, while the channel region 116 has a second conductivity that is opposite the first conductivity-type. For example, in an NMOS MuGFET, the source 120 and drain 122 could be n-type, and the channel region 116 could be p-type.

During operation, a gate-source voltage $V_{GS}$ (e.g., a wordline voltage) is selectively applied to the gate electrode 114 relative to the source 120 to free charged carriers from the lattice within the channel region 116. While the $V_{GS}$ (e.g., wordline voltage) is applied, a suitable drain-source voltage $V_{DS}$ (e.g., bitline voltage) can simultaneously be applied to "sweep" the charged carriers across the channel region 116 between source 120 and drain 122 along the gate length $L_1$, thereby altering the amount of charge stored in fin capacitor 104. More specifically, the amount of charge can be altered to correspond to one of at least two charge states associated with the memory cell 100.

To facilitate this functionality, one can see that the fin capacitor 104 comprises a gate electrode 124 that straddles the semiconductor fin 106. A dielectric layer 126 is sandwiched between the semiconductor fin 106 and the gate electrode 124, and electrically separates the semiconductor fin 106 from the gate electrode 124. Often, the gate electrode 124 will be tied to a fixed voltage, such as ground (GND). Thus, when charge is supplied to the fin capacitor 104 through the MuGFET 102, the semiconductor fin 106 under the gate electrode 124 acts as a first capacitor plate and the gate electrode 124 acts as a second capacitor plate.

In some embodiments, the fin capacitor 104 may include multiple semiconductor fins that extend under the gate electrode 124. In essence, the presence of multiple semiconductor fins may give the fin capacitor 104 a greater surface area between its plates, and may therefore provide higher capacitances, and/or more precisely matched capacitances.

In various embodiments, the second portion 111 of the semiconductor fin associated with the fin capacitor 104 may be highly doped. In comparison to conventional un-doped semiconductor fins, the highly doped portion of the semiconductor fin allows the fin capacitor 104 to have higher capacitance and lower resistance. This combination of higher capacitance and lower resistance facilitates more reliable data storage in the memory cell 100. Often, the doping type of this highly doped portion will be the same conductivity as the source 120 and drain 122. For example, if the source 120 and drain 122 are n-type, the second portion 111 of the semiconductor fin will also be n-type. Further, in some embodiments, the doping concentration of the second portion 111 may be very high, often degenerate. For example, in one embodiment where the semiconductor fin is made of silicon, the doping concentration associated with second portion 111 of the fin is similar to the doping concentration of the source 120 and the drain 122; therefore, the doping concentration of the second portion 111 of the fin may range from at least about $10^{18}$ atoms/cm^3 to at least about $10^{19}$ atoms/cm^3.

In various embodiments, the MuGFET 102 and fin capacitor 104 may have thick dielectrics to reduce gate leakage and capacitor leakage. For example, in one embodiment, the dielectrics 118, 126 could be $SiO_2$ and could have thicknesses from approximately 16 Angstroms to approximately 17 Angstroms. A high-K dielectric could also be used to provide a higher capacitance.

In various embodiments, the MuGFET 102 may be a long-channel transistor to further limit leakage beyond what can be achieved using a short-channel MuGFET. Although the precise dimensions of a long-channel MuGFET may scale as feature sizes are reduced, one example of a long-channel MuGFET could have a length that is approximately 20% larger than the length of a short channel MuGFET on the same integrated circuit. For example, in one embodiment of a 45 nm process, a typical short-channel MuGFET could have a channel length of approximately 40 nm, and a long-channel MuGFET could have a channel length of approximately 50 nm. Even though the channel length between these MuG-FETs differs by about 20%, the leakage of the long-channel MuGFET may be 2-3 times less than the leakage of the short-channel MuGFET. Therefore, the use of a long-channel MuGFET is advantageous over a short-channel MuGFET in some implementations.

Figure 3:
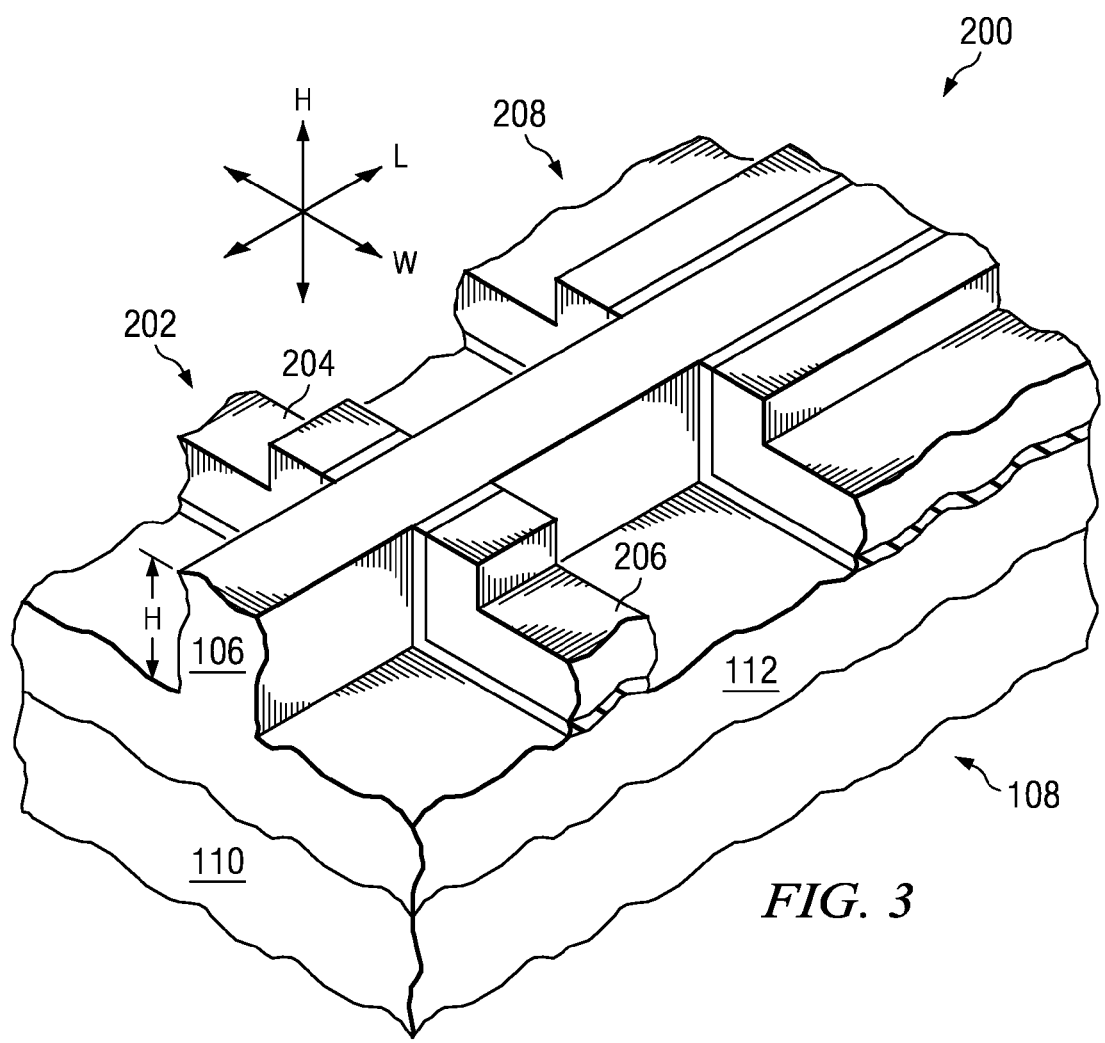
FIG. 3 shows a three-dimensional perspective view of a memory cell.

FIG. 3 shows another embodiment of a memory cell 200 that includes a split gate MuGFET 202 with a first split-gate electrode 204 and a second split gate electrode 206. During operation, the first and second split gate electrodes 204, 206 could be independently asserted relative to one another to perform various read and write operations. For example, in some implementations both split-gate electrodes 204, 206 could be asserted during read operations, while only one of the split-gate electrodes (e.g., 204) would be asserted during write operations. By contrast, in other implementations both split-gate electrodes 204, 206 could be asserted during write operations, while only one of the split-gate electrodes would be asserted during read operations. In still other embodiments, one split gate electrode could be used for reads, and the other split gate electrode could be used for writes. Other variations are also possible.

As also shown in FIG. 3, the memory cell 200 may include a split-gate fin capacitor 208. By using a split-gate fin capacitor 208, one may reduce the overall capacitance (relative to the previously discussed fin capacitor 104); however, fabrication may be easier if the pass gate transistor (i.e., MuGFET) is also a split gate device. In other embodiments, one of the fin capacitor and MuGFET could be a split-gate structure, while the other could be a non split-gate structure (e.g., where the other's gate electrode extends over the semiconductor fin.)

Figure 4:
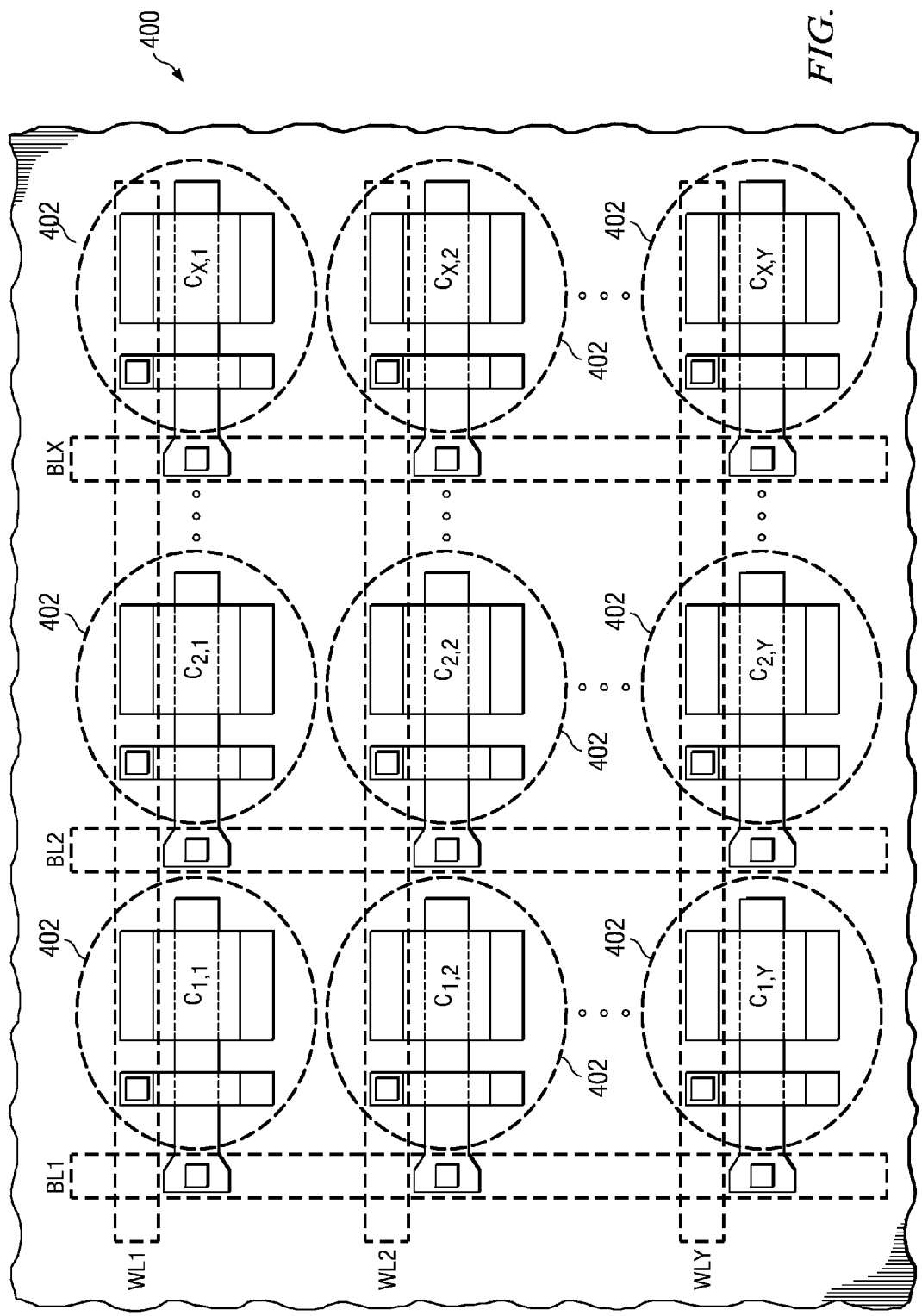
FIG. 4 shows an embodiment of an array of memory cells.

Now that several embodiments of memory cells in accordance with aspects of the invention have been set forth, FIG. 4 shows an example of how several of these memory cells could be arranged to form an array. Array 400 includes a number of memory cells 402, each of which could correspond to memory cell 100 or 200, that are each capable of storing one or more bits of data, depending on the implementation. The memory cells 402 are arranged in X columns (e.g., bits) and Y rows (e.g., words), where the fin capacitors of the memory array are indicated as $C_{COLUMN, ROW}$.

Each row of memory cells is an X bit data word accessible by activation of a wordline WL associated with that row. For example, in the first row of the array 400, the memory cells with fin capacitors $C_{1,1}$ through $C_{X,1}$ form an X bit data word that may be accessible by activation of wordline WL1 via bitlines BL1 through BLX. Generally speaking, while the wordline is asserted, data values can be read from or written to the memory cells in the corresponding row by properly biasing the bitlines.

Each column of memory cells includes Y bits, and can be accessed via a single bitline that is associated with the column of memory cells. For example, in the first column, the fin capacitors $C_{1,1}$ through $C_{1,Y}$ would be coupled to BL1.

Therefore, for purposes of illustration, if one wanted to write an X-bit word "0, 1, . . . , 1" to the first row of the memory array, one could first assert WL1 to "open" the first row of memory cells. While WL1 was asserted, one could apply a low-voltage to BL1, a high-voltage to BL2, . . . , and a high voltage to BL3; thereby programming the desired charges in the fin capacitors $C_{1,1}, C_{1,2}, \ldots, C_{X,1}$; respectively. Other voltage conventions could also be used. Because only wordline WL1 is asserted in this example, only the fin capacitors in the first row will be programmed and the capacitors in the non-accessed rows will not have their charges altered, even though each bitline could be coupled to the every memory cell within the bitline's column.

Depending on the implementation, there are various manners in which the wordlines and bitlines could be routed. For example, in one embodiment, the bitlines could be routed using semiconductor fins. Alternatively, the bitlines could be routed using polysilicon or metal. Typically, the wordlines could be routed in metal or polysilicon.

Figure 5:
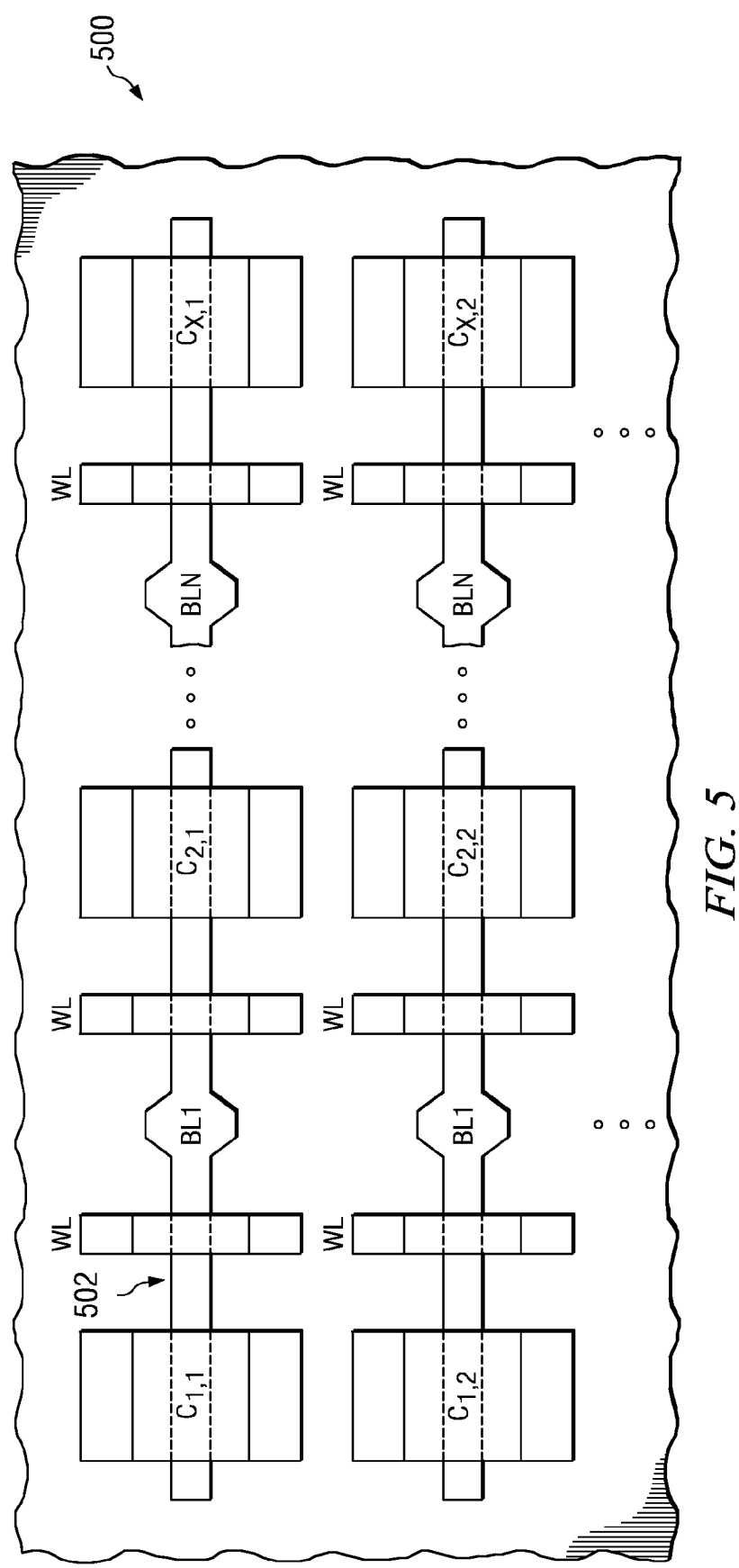
FIG. 5 shows an embodiment of an array of memory cells.

FIG. 5 shows another example of how several memory cells could be arranged to form an array 500. In array 500, a common semiconductor fin spans two adjacent memory cells. A common bitline couples individual columns of memory cells to one another. Thus, fin capacitors $C_{1,1}$ and $C_{2,1}$ share a common semiconductor fin 502, while fin capacitors $C_{1,1}$, $C_{2,1}$, $C_{1,2}$, and $C_{2,2}$, ... share common BL1. In some implementations, this array 500 could be used in conjunction with split-gate MuGFETs to facilitate data storage and retrieval.

Figure 6:
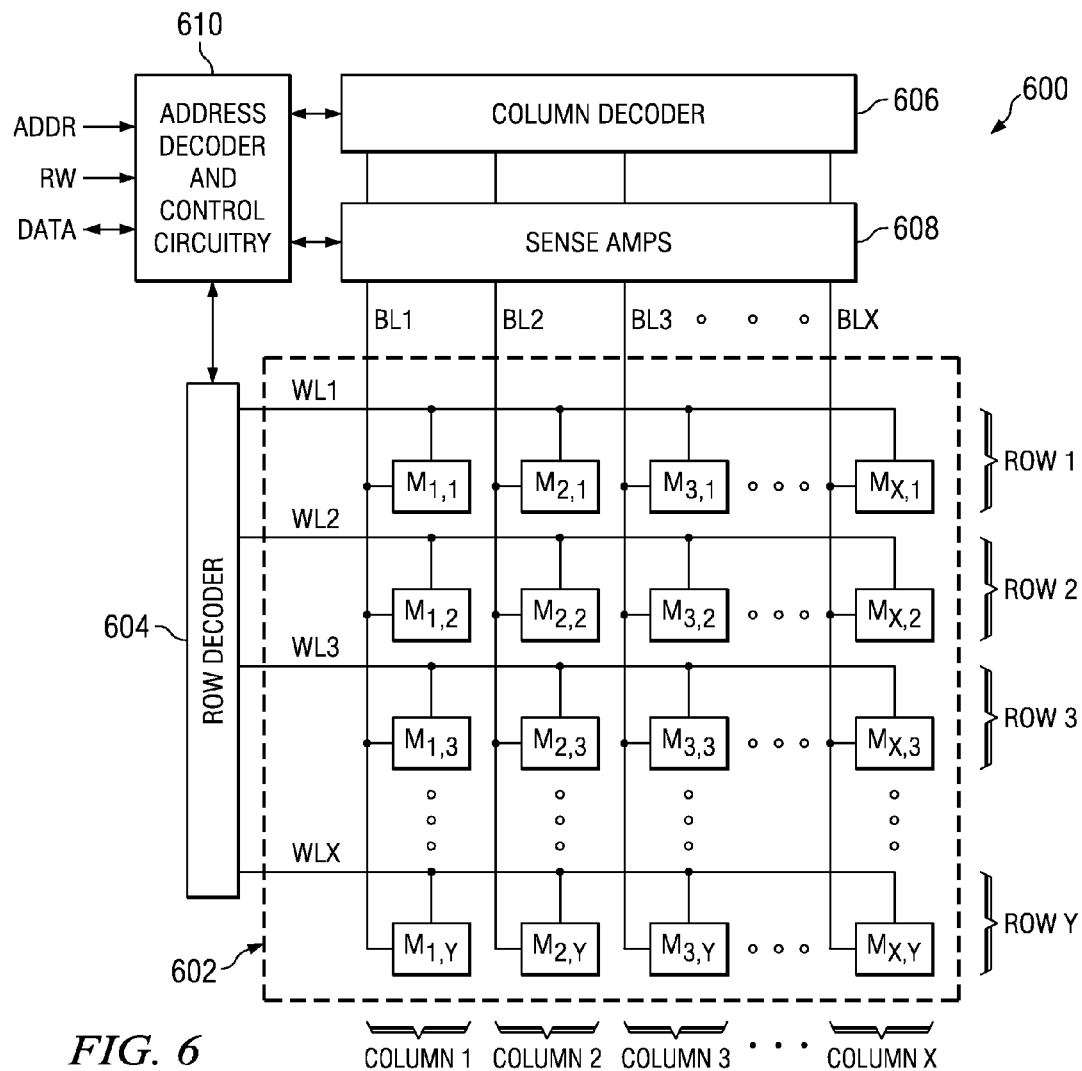
FIG. 6 shows an embodiment of a DRAM memory device cell that includes an array of memory cells.

Referring now to FIG. 6, one can see a dynamic random access memory (DRAM) device 600 that includes memory array 602, which could correspond to memory array 400 or 500 as previously described. In addition, the DRAM device 600 includes a row decoder 604, a column decoder 606, sense amps 608, and address decoder and control circuitry 610. As previously discussed, memory cells could be arranged within the array 602 in X columns (e.g., bits) and Y rows (e.g., words), where the memory cells are indicated as $M_{COLUMN, ROW}$.

To access a specific memory location, one provides the proper control signals to the address decoder and control circuitry. Typically, these control signals could include an address [ADDR] and a read/write control bit [RW], but could also include other signals (e.g., burst access, error codes, etc.).

To perform a write operation, for example, one could assert the read/write control bit [RW] to indicate a write operation, and also provide data [DATA] and an address [ADDR] where the data is to be written. The address decoder 610 would then map the address provided to a unique combination of rows and columns, and the control circuitry 610 would bias the proper wordlines and bitlines to facilitate writing the data to the memory cells of the array as previously discussed.

To perform a read operation, by contrast, one could assert the read/write control bit [RW] to indicate a read operation, and also provide an address [ADDR] from which data is to be read. Again, the address decoder 610 would then map the address provided to a unique combination of rows and columns. The read operation for the accessed cells starts when the sense amplifiers 608, each of which is typically associated with an individual column of cells, is switched off (e.g., decoupled from the bitlines). Notably, each sense amp usually includes a pair of cross-coupled inverters, one of which is tied to a bitline of a cell (e.g., BL1) and the other of which is coupled to a reference bitline (e.g., BL1R—not shown). Both the bitline and the reference bitline are pre-charged to a common pre-charged voltage. Next, pre-charging is stopped. Because the bitlines are isolated from other parts of the circuit, they will hold the pre-charge voltage for a brief time.

Next, the wordline of the accessed cell is opened, thereby altering the charge on the bitline associated with the accessed cell. Due to the positive feedback in the cross-coupled inverters, the voltage difference between the bitlines is amplified until one bitline is fully low and the other bitline is fully high. Once the bitlines have stabilized to a final value, the final value can be latched and subsequently provided to the data pins for a user's benefit.

Figure 7:
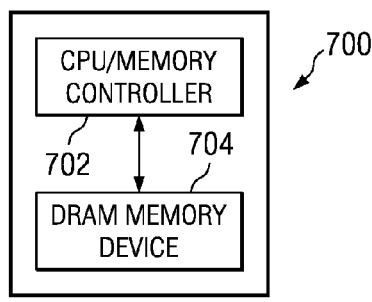
FIG. 7 shows one embodiment of a data processing system that includes a DRAM memory device.

FIG. 7 shows an embodiment of a data processing system 700 that comprises data processing circuitry 702 configured to process data; and a DRAM memory device 704 for storing the data. The DRAM memory device 704 may be any memory device as described herein. In one embodiment the data processing system 700 could be a communication device, such as a cell phone or pager, for example. In other embodiments, the data processing system 700 could be a portable electronic product, such as a portable computer, cell phone, pager, camera, music device, voice recorder, etc. In still other embodiments, the data processing system 700 could comprise an electronic system, such as a car, plane, industrial control system, etc.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory array, comprising:
   a plurality of memory cells arranged in at least two rows and columns, where a memory cell comprises:
   a multi-gate field effect transistor and a fin capacitor having a degenerate doping concentration coupled to a drain of the multi-gate field effect transistor;
   a plurality of wordlines, where each wordline is configured to access an individual row of memory cells; and
   a plurality of bitlines, where each bitline is associated with an individual column of memory cells and is configured to provide a pre-determined amount of charge to a fin capacitor of an accessed memory cell, thereby putting the accessed memory cell in one of at least two data states.

2. The memory array of claim 1, where one of the wordlines is coupled to gate electrodes of the multi-gate field effect transistors in an individual row.

3. The memory array of claim 1, where one of the bitlines is coupled to sources of the multi-gate field effect transistors in an individual column.

4. The memory array of claim 1, where a capacitor plate of the fin capacitor of the memory cell has an approximately degenerate doping concentration.

5. The memory cell of claim 1, where the multi-gate field effect transistor of the memory cell is a long-channel device with a channel length that is at least approximately 20% longer than a short-channel device on a die with the multi-gate field effect transistor.

6. The memory cell of claim 1, where the multi-gate field effect transistor is a split-gate transistor having a first split-gate electrode and a second gate electrode that are independently assertable.

7. The memory array of claim 1, where the bitlines comprise semiconductor fins.

8. The memory array of claim 1, where the fin capacitor comprises:
   a semiconductor fin extending vertically from a semiconductor body;
   a dielectric overlying a first portion of the semiconductor fin; and
   a gate electrode overlying the dielectric.

9. The memory array of claim 8, where the multi-gate field effect transistor is associated with a second portion of the semiconductor fin.

10. The memory array of claim 1, where the bitlines comprise a polysilicon layer.

11. The memory array of claim 1, where the bitlines comprise a metal layer.

12. The memory array of claim 1, where the wordlines comprise a metal layer.

13. A data processing system, comprising:
   data processing circuitry configured to process data; and
   a DRAM memory device for storing the data that comprises a plurality of memory cells, where a memory cell comprises:
      a multi-gate field effect transistor associated with a first portion of a semiconductor fin; and
      a fin capacitor coupled to a drain of the multi-gate field effect transistor and associated with a second portion of the semiconductor fin, where the fin capacitor has an approximately degenerate doping concentration in the second portion.

14. The data processing system of claim 13 where the plurality of memory cells are arranged in at least two rows and columns, further comprising:
   a plurality of wordlines, where each wordline is configured to access an individual row of memory cells; and
   a plurality of bitlines, where each bitline is associated with an individual column of memory cells and is configured to provide a pre-determined amount of charge to a fin capacitor of an accessed memory cell, thereby putting the accessed memory cell in one of at least two data states.

\* \* \* \* \*